(12) United States Patent
Hussell

(10) Patent No.: US 12,364,074 B2
(45) Date of Patent: Jul. 15, 2025

(54) LIGHT EMITTING DIODES AND METHODS

(71) Applicant: CreeLED, Inc., Durham, NC (US)

(72) Inventor: Christopher P. Hussell, Cary, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 15/676,965

(22) Filed: Aug. 14, 2017

(65) Prior Publication Data

US 2018/0076368 A1 Mar. 15, 2018
US 2019/0355886 A9 Nov. 21, 2019

Related U.S. Application Data

(63) Continuation-in-part of application No. 15/087,641, filed on Mar. 31, 2016.
(Continued)

(51) Int. Cl.
*H01L 33/58* (2010.01)
*H01L 25/075* (2006.01)
(Continued)

(52) U.S. Cl.
CPC ....... *H10H 20/856* (2025.01); *H01L 25/0753* (2013.01); *H10H 20/852* (2025.01);
(Continued)

(58) Field of Classification Search
CPC .......... H01L 51/5234; H01L 33/56; H01L 2933/005; H01L 33/60; H01L 33/504; H01L 33/58; H01L 2933/0058; H01L 25/0753; H10H 20/852; H10H 20/855; H10H 20/857; H10H 29/142; H10H 29/00; H10H 20/00; H10H 29/854; H10H 29/8552
See application file for complete search history.

(56) References Cited

U.S. PATENT DOCUMENTS 1,014,179 A * 1/1912 Roney ............... F16K 31/52408
251/257
4,473,277 A 9/1984 Brown
(Continued)

FOREIGN PATENT DOCUMENTS

CA 2 936 473 A1 1/2018
CN 201340702 11/2009
(Continued)

OTHER PUBLICATIONS

Final Office Action for U.S. Appl. No. 15/087,641 dated Sep. 20, 2018.
(Continued)

Primary Examiner — Mary A Wilczewski
Assistant Examiner — Tsz K Chiu
(74) Attorney, Agent, or Firm — Withrow & Terranova, P.L.L.C.

(57) ABSTRACT

Light emitting diode (LED) devices, methods and systems are provided. An example apparatus can include an underfill layer separate from a bonding layer. The apparatus can further include a dark encapsulating layer comprising an epoxy-molded compound which is applied using a powder-coating process. A method for providing a powder-coated encapsulation and for producing an LED panel with such an encapsulant is disclosed.

20 Claims, 7 Drawing Sheets

Related U.S. Application Data

(60) Provisional application No. 62/141,065, filed on Mar. 31, 2015.

(51) Int. Cl.
    H01L 27/15      (2006.01)
    H01L 33/62      (2010.01)
    H10H 20/852     (2025.01)
    H10H 20/856     (2025.01)
    H10H 20/857     (2025.01)
    H01L 23/00          (2006.01)
    H10H 20/01          (2025.01)
    H10H 20/853         (2025.01)
    H10H 20/854         (2025.01)
    H10H 20/855         (2025.01)

(52) U.S. Cl.
    CPC ........... *H10H 20/857* (2025.01); *H01L 24/13* (2013.01); *H01L 24/16* (2013.01); *H01L 24/29* (2013.01); *H01L 24/48* (2013.01); *H01L 24/73* (2013.01); *H01L 2224/13101* (2013.01); *H01L 2224/16225* (2013.01); *H01L 2224/29101* (2013.01); *H01L 2224/32225* (2013.01); *H01L 2224/48227* (2013.01); *H01L 2224/48471* (2013.01); *H01L 2224/73265* (2013.01); *H01L 2924/00014* (2013.01); *H01L 2924/12041* (2013.01); *H01L 2924/181* (2013.01); *H10H 20/0362* (2025.01); *H10H 20/0363* (2025.01); *H10H 20/853* (2025.01); *H10H 20/854* (2025.01); *H10H 20/855* (2025.01)

(56) References Cited

U.S. PATENT DOCUMENTS

| | | | |
|---|---|---|---|
| 4,918,497 A | 4/1990 | Edmond | |
| 4,946,547 A | 8/1990 | Palmour et al. | |
| 4,966,862 A | 10/1990 | Edmond | |
| 5,027,168 A | 6/1991 | Edmond | |
| 5,200,022 A | 4/1993 | Kong et al. | |
| 5,210,051 A | 5/1993 | Carter, Jr. | |
| 5,338,944 A | 8/1994 | Edmond et al. | |
| 5,359,345 A | 10/1994 | Hunter | |
| 5,382,811 A | 1/1995 | Takahashi | |
| RE34,861 E | 2/1995 | Davis et al. | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |
| 5,739,554 A | 4/1998 | Edmond et al. | |
| 5,912,477 A | 6/1999 | Negley | |
| 6,120,600 A | 9/2000 | Edmond et al. | |
| 6,187,606 B1 | 2/2001 | Edmond et al. | |
| 6,195,882 B1 | 3/2001 | Tsukamoto et al. | |
| 6,201,262 B1 | 3/2001 | Edmond et al. | |
| 6,600,175 B1 | 7/2003 | Baretz et al. | |
| 6,791,119 B2 | 9/2004 | Slater et al. | |
| 6,853,010 B2 | 2/2005 | Slater et al. | |
| 6,958,497 B2 | 10/2005 | Emerson et al. | |
| 7,095,056 B2 | 8/2006 | Vitta et al. | |
| 7,128,442 B2 | 10/2006 | Lee et al. | |
| 7,213,940 B1 | 5/2007 | van De Ven et al. | |
| 7,244,965 B2 | 7/2007 | Andrews et al. | |
| 7,256,486 B2 | 8/2007 | Lee et al. | |
| 7,279,355 B2 | 10/2007 | Lee et al. | |
| 7,382,976 B1* | 6/2008 | Mok | G02B 3/14 257/100 |
| 7,445,354 B2* | 11/2008 | Aoki | H01L 33/60 362/240 |
| 7,456,035 B2* | 11/2008 | Eliashevich | H01L 25/0753 257/E21.511 |
| 7,456,499 B2 | 11/2008 | Loh et al. | |
| 7,564,180 B2 | 7/2009 | Brandes | |
| 7,655,957 B2 | 2/2010 | Loh et al. | |
| 7,678,595 B2* | 3/2010 | Chang | B29C 45/1671 257/E21.511 |
| 7,791,061 B2 | 9/2010 | Edmond et al. | |
| 7,802,901 B2 | 9/2010 | McMillan | |
| 7,821,023 B2 | 10/2010 | Yuan et al. | |
| 7,919,787 B2 | 4/2011 | Lee et al. | |
| 7,952,544 B2 | 5/2011 | Roberts | |
| 7,960,819 B2 | 6/2011 | Loh et al. | |
| 7,999,283 B2 | 8/2011 | Chakraborty et al. | |
| 8,018,135 B2 | 9/2011 | Van De Ven et al. | |
| 8,044,418 B2 | 10/2011 | Loh et al. | |
| 8,058,088 B2 | 11/2011 | Cannon et al. | |
| 8,125,137 B2 | 2/2012 | Medendorp, Jr. et al. | |
| 8,264,138 B2 | 9/2012 | Negley et al. | |
| 8,337,071 B2 | 12/2012 | Negley et al. | |
| 8,373,182 B2* | 2/2013 | Seko | H01L 33/60 257/88 |
| 8,563,339 B2 | 10/2013 | Tarsa et al. | |
| 8,729,589 B2 | 5/2014 | Hussell et al. | |
| 8,735,928 B2 | 5/2014 | Jager et al. | |
| 8,866,410 B2 | 10/2014 | Negley et al. | |
| 8,940,561 B2 | 1/2015 | Donofrio et al. | |
| 8,970,131 B2 | 3/2015 | Brandes et al. | |
| 8,981,415 B1* | 3/2015 | Hsu | H01L 33/504 257/100 |
| 9,024,349 B2 | 5/2015 | Chitnis et al. | |
| 9,054,257 B2 | 6/2015 | Chan et al. | |
| 9,131,561 B2 | 9/2015 | Athalye | |
| 9,159,888 B2 | 10/2015 | Chitnis et al. | |
| 9,277,605 B2 | 3/2016 | Ni | |
| 9,406,852 B2 | 8/2016 | Nakabayashi et al. | |
| 9,414,454 B2 | 8/2016 | Brandes et al. | |
| 9,607,958 B2 | 3/2017 | Lin et al. | |
| 9,680,071 B2 | 6/2017 | Nakabayashi et al. | |
| 9,682,886 B1 | 6/2017 | Almanza-Workman et al. | |
| 9,713,211 B2 | 7/2017 | van de Ven et al. | |
| 9,735,198 B2 | 8/2017 | Joo et al. | |
| 9,887,329 B2* | 2/2018 | Yamada | H01L 33/483 |
| 9,966,370 B2 | 5/2018 | Moosburger et al. | |
| 10,043,960 B2* | 8/2018 | Andrews | H01L 33/60 |
| 10,312,285 B2* | 6/2019 | Mizuta | H01L 27/153 |
| 10,325,962 B2* | 6/2019 | Kim | H01L 51/56 |
| 10,388,838 B2* | 8/2019 | Hung | H01L 33/0075 |
| 10,453,827 B1 | 10/2019 | Hussell et al. | |
| 10,910,523 B2* | 2/2021 | Hung | H01L 33/56 |
| 11,171,123 B2 | 11/2021 | Tangring | |
| 11,245,057 B2* | 2/2022 | Maeda | H01L 33/0095 |
| 11,322,662 B2 | 5/2022 | Brandl et al. | |
| 11,508,887 B2* | 11/2022 | Chen | H01L 33/52 |
| 11,870,022 B2* | 1/2024 | Chen | H10H 29/142 |
| 2001/0032985 A1* | 10/2001 | Bhat | H01L 33/405 257/E33.068 |
| 2002/0125044 A1 | 9/2002 | Johnson | |
| 2002/0131151 A1 | 9/2002 | Engler et al. | |
| 2003/0143423 A1* | 7/2003 | McCormick | H01L 51/5259 428/690 |
| 2003/0146695 A1 | 8/2003 | Seki | |
| 2003/0151361 A1 | 8/2003 | Ishizaka | |
| 2004/0062040 A1 | 4/2004 | Blume et al. | |
| 2004/0069993 A1 | 4/2004 | Murano | |
| 2005/0023550 A1* | 2/2005 | Eliashevich | H01L 33/0093 438/22 |
| 2005/0035356 A1 | 2/2005 | Kek et al. | |
| 2005/0045897 A1* | 3/2005 | Chou | H01L 25/0753 257/89 |
| 2005/0184387 A1 | 8/2005 | Collins et al. | |
| 2005/0212447 A1* | 9/2005 | Oh | H01L 27/3272 315/169.3 |
| 2006/0006404 A1* | 1/2006 | Ibbetson | H01L 33/62 438/22 |
| 2006/0018608 A1* | 1/2006 | Mizoguchi | G02B 6/4204 385/92 |
| 2006/0060870 A1* | 3/2006 | Park | H01L 27/322 257/88 |
| 2006/0118807 A1 | 6/2006 | Ives et al. | |
| 2006/0145172 A1 | 7/2006 | Su et al. | |

(56) References Cited

U.S. PATENT DOCUMENTS

| | | |
|---|---|---|
| 2006/0148971 A1 | 7/2006 | Jing et al. |
| 2006/0152668 A1 | 7/2006 | Jang et al. |
| 2006/0157722 A1 | 7/2006 | Takezawa et al. |
| 2006/0193121 A1* | 8/2006 | Kamoshita ............ H01L 33/508 |
| | | 362/800 |
| 2006/0198162 A1 | 9/2006 | Ishidu et al. |
| 2006/0221272 A1 | 10/2006 | Negley et al. |
| 2006/0261364 A1 | 11/2006 | Suehiro et al. |
| 2007/0085944 A1 | 4/2007 | Tanaka et al. |
| 2007/0104828 A1 | 5/2007 | Fornaguera |
| 2007/0139923 A1 | 6/2007 | Negley et al. |
| 2007/0158668 A1 | 7/2007 | Tarsa et al. |
| 2007/0161211 A1 | 7/2007 | Sunohara et al. |
| 2007/0170447 A1 | 7/2007 | Negley et al. |
| 2007/0178629 A1 | 8/2007 | Ogawa et al. |
| 2007/0223219 A1 | 9/2007 | Medendorp, Jr. et al. |
| 2007/0228387 A1 | 10/2007 | Negley et al. |
| 2007/0253209 A1 | 11/2007 | Loh et al. |
| 2007/0262323 A1 | 11/2007 | Sonobe et al. |
| 2007/0262339 A1 | 11/2007 | Hussell et al. |
| 2007/0268694 A1 | 11/2007 | Bailey et al. |
| 2008/0012036 A1 | 1/2008 | Loh et al. |
| 2008/0048200 A1* | 2/2008 | Mueller ................. B29C 41/20 |
| | | 257/98 |
| 2008/0121921 A1 | 5/2008 | Loh et al. |
| 2008/0173884 A1 | 7/2008 | Chitnis et al. |
| 2008/0179611 A1 | 7/2008 | Chitnis et al. |
| 2008/0198112 A1 | 8/2008 | Roberts |
| 2008/0218072 A1* | 9/2008 | Haruna .................. H01L 33/54 |
| | | 445/35 |
| 2008/0224608 A1 | 9/2008 | Konishi et al. |
| 2008/0233666 A1 | 9/2008 | Park et al. |
| 2008/0258130 A1 | 10/2008 | Bergmann et al. |
| 2008/0258156 A1 | 10/2008 | Hata |
| 2008/0284307 A1 | 11/2008 | Kuo |
| 2008/0298063 A1 | 12/2008 | Hayashi |
| 2008/0308825 A1 | 12/2008 | Chakraborty et al. |
| 2009/0050907 A1 | 2/2009 | Yuan et al. |
| 2009/0050908 A1 | 2/2009 | Yuan et al. |
| 2009/0057690 A1 | 3/2009 | Chakraborty |
| 2009/0079328 A1* | 3/2009 | Fedorovskaya ..... H01L 51/5256 |
| | | 313/504 |
| 2009/0080185 A1 | 3/2009 | McMillan |
| 2009/0108281 A1 | 4/2009 | Keller et al. |
| 2009/0115313 A1 | 5/2009 | Lu et al. |
| 2009/0127702 A1* | 5/2009 | Dekker ................. H01L 21/486 |
| | | 257/713 |
| 2009/0146176 A1 | 6/2009 | Oishi |
| 2009/0160363 A1 | 6/2009 | Negley et al. |
| 2009/0173956 A1 | 7/2009 | Aldaz et al. |
| 2009/0184616 A1 | 7/2009 | Van De Ven et al. |
| 2009/0230409 A1 | 9/2009 | Basin et al. |
| 2010/0060553 A1 | 3/2010 | Zimmerman et al. |
| 2010/0140655 A1 | 6/2010 | Shi |
| 2010/0155763 A1 | 6/2010 | Donofrio et al. |
| 2010/0200898 A1 | 8/2010 | Lin et al. |
| 2010/0237375 A1 | 9/2010 | Yamazaki et al. |
| 2010/0246152 A1 | 9/2010 | Lin et al. |
| 2010/0252851 A1 | 10/2010 | Emerson et al. |
| 2010/0258830 A1 | 10/2010 | Ide et al. |
| 2011/0006334 A1 | 1/2011 | Ishii et al. |
| 2011/0031524 A1 | 2/2011 | Pei |
| 2011/0068702 A1 | 3/2011 | van De Ven et al. |
| 2011/0079801 A1 | 4/2011 | Zhang et al. |
| 2011/0140148 A1 | 6/2011 | Liu |
| 2011/0176301 A1 | 7/2011 | Liang et al. |
| 2011/0291125 A1 | 12/2011 | Donauer et al. |
| 2011/0316024 A1 | 12/2011 | Hung et al. |
| 2012/0056228 A1 | 3/2012 | Horng et al. |
| 2012/0112220 A1 | 5/2012 | West et al. |
| 2012/0126262 A1 | 5/2012 | Huang et al. |
| 2012/0149138 A1 | 6/2012 | Su et al. |
| 2012/0153340 A1 | 6/2012 | Song et al. |
| 2012/0193788 A1 | 8/2012 | Fu et al. |
| 2012/0206503 A1 | 8/2012 | Hirakata |
| 2012/0235169 A1* | 9/2012 | Seko ....................... H01L 33/60 |
| | | 257/E33.059 |
| 2012/0248469 A1 | 10/2012 | Choi |
| 2012/0261689 A1 | 10/2012 | Appelt et al. |
| 2012/0305949 A1 | 12/2012 | Donofrio et al. |
| 2012/0319150 A1 | 12/2012 | Shimomura et al. |
| 2013/0026520 A1 | 1/2013 | Hu et al. |
| 2013/0069525 A1 | 3/2013 | Imai |
| 2013/0075902 A1 | 3/2013 | Chow et al. |
| 2013/0092966 A1 | 4/2013 | Jaeger et al. |
| 2013/0093313 A1 | 4/2013 | Oyamada |
| 2013/0134454 A1 | 5/2013 | Chan et al. |
| 2013/0163244 A1* | 6/2013 | Suzuki .................... H01L 33/62 |
| | | 362/235 |
| 2013/0187178 A1 | 7/2013 | Tischler |
| 2013/0207141 A1 | 8/2013 | Reiherzer |
| 2013/0256711 A1 | 10/2013 | Joo et al. |
| 2013/0264589 A1 | 10/2013 | Bergmann et al. |
| 2013/0270592 A1 | 10/2013 | Reiherzer et al. |
| 2013/0279169 A1 | 10/2013 | Reiherzer et al. |
| 2013/0307013 A1 | 11/2013 | Chan et al. |
| 2013/0334959 A1 | 12/2013 | Wang et al. |
| 2014/0042467 A1 | 2/2014 | Livesay et al. |
| 2014/0070235 A1 | 3/2014 | Andrews et al. |
| 2014/0077682 A1 | 3/2014 | Ho et al. |
| 2014/0091326 A1* | 4/2014 | Tran ................... H01L 31/02325 |
| | | 257/81 |
| 2014/0153238 A1 | 6/2014 | Nishimura et al. |
| 2014/0239325 A1* | 8/2014 | Andrews ............. H01L 25/0753 |
| | | 257/98 |
| 2014/0239332 A1* | 8/2014 | Iwakura ................ H01L 33/505 |
| | | 257/98 |
| 2014/0346545 A1 | 11/2014 | Chan et al. |
| 2014/0362570 A1 | 12/2014 | Miyoshi et al. |
| 2014/0367713 A1 | 12/2014 | Zhang et al. |
| 2015/0021642 A1 | 1/2015 | Nakabayashi |
| 2015/0028307 A1* | 1/2015 | Kim ..................... H01L 51/5246 |
| | | 257/40 |
| 2015/0049510 A1 | 2/2015 | Haiberger et al. |
| 2015/0129902 A1 | 5/2015 | Iino |
| 2015/0162317 A1* | 6/2015 | Tran ................... H01L 31/02325 |
| | | 438/25 |
| 2015/0194583 A1 | 7/2015 | Sabathil ................ H01L 25/167 |
| | | 438/27 |
| 2015/0257211 A1 | 9/2015 | Johnson et al. |
| 2015/0287892 A1 | 10/2015 | Han et al. |
| 2015/0371585 A1 | 12/2015 | Bower et al. |
| 2016/0027973 A1 | 1/2016 | Maki |
| 2016/0043064 A1* | 2/2016 | Tran ................... H01L 31/02325 |
| | | 257/82 |
| 2016/0181476 A1 | 6/2016 | Chang et al. |
| 2016/0181491 A1* | 6/2016 | Sabathil ............. H01L 25/0753 |
| | | 257/98 |
| 2016/0293811 A1* | 10/2016 | Hussell ............... H01L 25/0753 |
| 2016/0293812 A1* | 10/2016 | Pindl .................. H01L 31/02322 |
| 2016/0351539 A1 | 12/2016 | Bower et al. |
| 2017/0005079 A1* | 1/2017 | Hoeppel ................. H01L 33/58 |
| 2017/0062681 A1 | 3/2017 | Miyoshi et al. |
| 2017/0092690 A1* | 3/2017 | Mizuta .................. H01L 27/153 |
| 2017/0154880 A1 | 6/2017 | Ozeki et al. |
| 2017/0345801 A1 | 11/2017 | Lin et al. |
| 2017/0345866 A1 | 11/2017 | Joo et al. |
| 2017/0358624 A1 | 12/2017 | Takeya et al. |
| 2018/0006192 A1* | 1/2018 | Rudmann ............... H01L 33/58 |
| 2018/0076368 A1 | 3/2018 | Hussell |
| 2018/0097164 A1 | 4/2018 | Katsumata et al. |
| 2018/0105669 A1* | 4/2018 | Otsubo ..................... C08J 3/14 |
| 2018/0195675 A1 | 7/2018 | Miyoshi et al. |
| 2018/0358405 A1 | 12/2018 | Chaji et al. |
| 2019/0009766 A1* | 1/2019 | Meckenstock ........ B60T 13/567 |
| 2019/0051762 A1* | 2/2019 | Yu ........................... H01L 33/44 |
| 2019/0123213 A1* | 4/2019 | Yu ......................... H01L 31/1876 |
| 2019/0355884 A1* | 11/2019 | Pan ...................... H01L 27/156 |
| 2019/0355886 A9 | 11/2019 | Hussell |
| 2020/0235084 A1* | 7/2020 | Wu ......................... H10H 20/85 |

(56) References Cited

U.S. PATENT DOCUMENTS

FOREIGN PATENT DOCUMENTS

| | | | | |
|---|---|---|---|---|
| CN | 201355545 | | 12/2009 | |
| CN | 201688336 | | 12/2010 | |
| CN | 104979338 | A * | 10/2015 | ......... H01L 25/0753 |
| CN | 103718325 | B * | 3/2017 | ......... H01L 51/5281 |
| CN | 107438899 | A | 12/2017 | |
| CN | 107438899 | B | 4/2021 | |
| DE | 102013112549 | A1 | 5/2015 | |
| EP | 2211394 | A2 | 7/2010 | |
| EP | 2472578 | A2 | 7/2012 | |
| EP | 2693854 | A2 * | 2/2014 | ............ F21V 31/005 |
| EP | 2811517 | A1 | 12/2014 | |
| EP | 3 364 458 | A1 | 8/2018 | |
| JP | H10247748 | A | 9/1998 | |
| JP | 2000022218 | A | 1/2000 | |
| JP | 2001160630 | A | 6/2001 | |
| JP | 2002033517 | A * | 1/2002 | |
| JP | 2006093435 | A | 4/2006 | |
| JP | 2007189006 | A | 7/2007 | |
| JP | WO2009069671 | A1 * | 6/2009 | ......... H10H 20/8515 |
| JP | 2010-157638 | * | 7/2010 | ......... H01L 25/0753 |
| JP | 2010157638 | A | 7/2010 | |
| KR | 20080030811 | A | 4/2008 | |
| KR | 100933920 | B1 | 12/2009 | |
| KR | 20100008509 | A | 1/2010 | |
| KR | 20110111941 | A | 10/2011 | |
| TW | 201 214 795 | A | 4/2012 | |
| WO | WO 2016/161161 | | 10/2016 | |
| WO | WO 2019/231843 | A1 | 12/2019 | |

OTHER PUBLICATIONS

Restriction Requirement for U.S. Appl. No. 15/087,641 dated Nov. 20, 2017.
Restriction Requirement for U.S. Appl. No. 15/654,323 dated Dec. 28, 2017.
Notice of Publication for Application No. PCT/US2016/025346 dated Oct. 6, 2016.
International Search Report and Written Opinion for Application No. PCT/US2016/025346 dated Aug. 2, 2016.
Non-Final Office Action for U.S. Appl. No. 15/087,641 dated Feb. 23, 2018.
Non-Final Office Action for U.S. Appl. No. 15/654,323 dated May 8, 2018.
Chinese Office Action for Application No. 201680019859.4 dated May 27, 2019.
Notice of Allowance for U.S. Appl. No. 15/993,540 dated Jun. 13, 2019.
Non-Final Office Action for U.S. Appl. No. 15/993,540 dated Feb. 21, 2019.
Non-Final Office Action for U.S. Appl. No. 15/087,641 dated Oct. 3, 2019.
International Search Report and Written Opinion for Application No. PCT/US2019/033914 dated Sep. 5, 2019.
Non-Final Office Action for U.S. Appl. No. 15/087,641 dated May 1, 2020.
Chinese Office Action for Application No. 201680019859 dated May 6, 2020.
Non-Final Office Action for U.S. Appl. No. 15/087,641 dated Oct. 9, 2020.
Chinese Supplementary Search for Application No. 201680019859.4 dated Jan. 5, 2021.
Final Office Action for U.S. Appl. No. 15/087,641 dated Apr. 16, 2021.
Notice of Allowance for U.S. Appl. No. 15/654,323, mailed Jan. 31, 2020, 8 pages.
Final Office Action for U.S. Appl. No. 15/654,323, mailed Mar. 1, 2019, 9 pages.
Non-Final Office Action for U.S. Appl. No. 15/654,323, mailed Jul. 23, 2019, 9 pages.
Final Office Action for U.S. Appl. No. 15/654,323, mailed Nov. 21, 2019, 10 pages.
Non-Final Office Action for U.S. Appl. No. 15/087,641, mailed Oct. 27, 2021.
Final Office Action for U.S. Appl. No. 15/087,641, mailed Apr. 29, 2022, 17 pages.
Advisory Action for U.S. Appl. No. 15/087,641, mailed Jul. 12, 2022, 3 pages.
Non-Final Office Action for U.S. Appl. No. 15/087,641, mailed Aug. 5, 2022, 17 pages.
Final Office Action for U.S. Appl. No. 15/087,641, mailed Jan. 23, 2023, 17 pages.
Advisory Action for U.S. Appl. No. 15/087,641, mailed Mar. 24, 2023, 3 pages.
Non-Final Office Action for U.S. Appl. No. 15/087,641, mailed May 26, 2023, 16 pages.
Advisory Action for U.S. Appl. No. 15/087,641, mailed Jan. 29, 2024, 3 pages.
Non-Final Office Action for U.S. Appl. No. 15/087,641, mailed Mar. 28, 2024, 15 pages.
Second Office Action for Chinese Patent Application No. 202110389262.1, mailed Apr. 1, 2024, 13 pages.
Notification to Grant for Chinese Patent Application No. 202110389262.1, mailed Jul. 12, 2024, 8 pages.
Final Office Action for U.S. Appl. No. 15/087,641, mailed Oct. 11, 2024, 10 pages.
Final Office Action for U.S. Appl. No. 15/087,641, mailed Nov. 15, 2023, 14 pages.
First Office Action for Chinese Patent Application No. 202110389262.1, mailed Sep. 21, 2023, 22 pages.

* cited by examiner

LIGHT EMITTING DIODES AND METHODS

CROSS REFERENCE TO RELATED APPLICATION

This application is a continuation-in-part from and claims priority to U.S. patent application Ser. No. 15/087,641, filed on Mar. 31, 2016, now U.S. Pat. No. 12,294,042, which claims the benefit of provisional patent application Ser. No. 62/141,065, filed on Mar. 31, 2015, the disclosures of which are incorporated herein by reference.

TECHNICAL FIELD

The subject matter disclosed herein relates generally to light emitting diodes (LEDs), components, and related methods. More particularly, the subject matter disclosed herein relates to solid state lighting apparatuses and related methods for controlling light output.

BACKGROUND

Light emitting diodes or "LEDs" are solid state devices that convert electrical energy into light. LEDs can be utilized in light emitter devices or components for providing different colors and patterns of light useful in various lighting and optoelectronic applications. One such application is the use of LEDs in video screens. LED video displays typically comprise arrays of red, green, and blue LEDs mounted on a single electronic device attached to a printed circuit board (PCB) that controls the output of each electronic device.

Conventional LED arrays often have a transparent encapsulant covering the individual LEDs to protect the devices and maximize the efficiency of the devices. When used in some applications such as video screens, however, it may be desirable to reduce and/or enhance the amount of reflected light. Controlling the amount of reflected light can provide benefits such as increased contrast and image sharpness. One method to achieve this benefit is with a dark-colored encapsulant.

SUMMARY

Substrate based LEDs and related methods having improved reliability and performance are provided and described herein. Devices, components, and methods described herein can advantageously exhibit improved processing times, ease of manufacture, and/or lower processing costs. Devices, components, and related methods described herein are well suited for a variety of applications such as personal, industrial, and commercial lighting applications including, for example, light bulbs and light fixture products and/or applications. In some aspects, devices, components, and related methods described herein can comprise improved LED manufacturing processes and/or improved optical properties including improved light output, contrast, and more consistent and uniform light emission and color. Such devices can be less expensive and more efficient.

Improved substrates for LEDs and LED devices are provided. In some aspects, an LED apparatus can comprise a substrate, one or more LEDs, and an encapsulant portion or layer that can serve or be an underfill portion or layer. The underfill layer can be applied after attachment of the one or more LEDs to the substrate. The underfill layer can be disposed around the one or more LEDs and at least partially between the one or more LEDs and the substrate and with or without covering a top surface of the one or more LEDs.

In other aspects, an LED apparatus can comprise a substrate, one or more LEDs, and a powder-coated material disposed over the substrate.

In other aspects, an LED apparatus can comprise a substrate, one or more LEDs, a substantially clear layer disposed over the substrate and one or more LEDs, and a dark layer disposed over the clear layer. The dark layer is adapted to be at least partially or completely removed from a region above the one or more LEDs.

In other aspects, a method of producing a panel of LEDs comprises providing a substrate with at least one LED disposed over the substrate, applying a substantially clear layer over the at least one LED, applying a dark layer over the clear layer, and removing the dark layer in a region above the at least one LED to expose at least a portion of the clear layer.

In other aspects, a method of coating a LED comprises providing a substrate with at least one LED disposed over the substrate, preparing an epoxy powder, and powder-coating the substrate and/or the LED.

These and other objects of the present disclosure as can become apparent from the disclosure herein are achieved, at least in whole or in part, by the subject matter disclosed herein.

BRIEF DESCRIPTION OF DRAWINGS

A full and enabling disclosure of the present subject matter is set forth more particularly in the remainder of the specification, including reference to the accompanying example figures, relating to one or more embodiments, in which.

DETAILED DESCRIPTION

Figure 1:
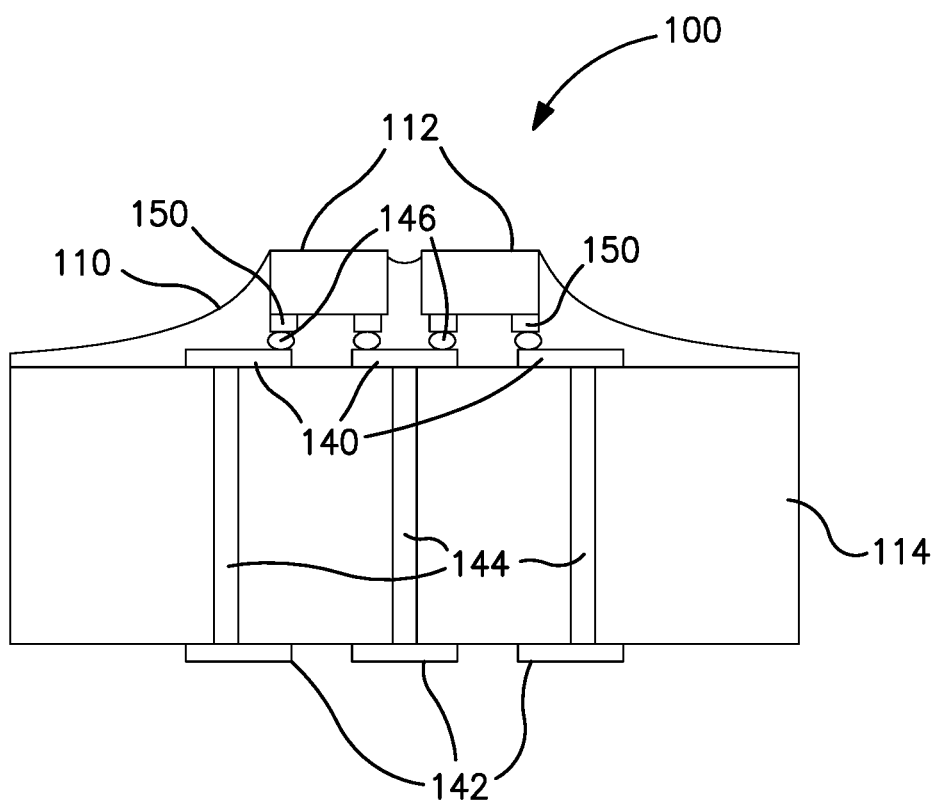
FIG. 1 is a cross-sectional side view of an embodiment of an LED apparatus.

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising", "including", and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common anode configurations among mutually exclusive groups/segments/sets. The segments of LEDs can be configured in a number of different ways and may have circuits of varying functionality associated therewith (e.g. driver circuits, rectifying circuits, current limiting circuits, shunts, bypass circuits, etc.), as discussed, for example, in commonly assigned U.S. patent application Ser. No. 12/566,195, filed on Sep. 24, 2009, now U.S. Pat. No. 9,713,211, U.S. patent application Ser. No. 13/769,273, filed on Feb. 15, 2013, now U.S. Pat. No. 8,970,131, U.S. patent application Ser. No. 13/769,277 filed on Feb. 15, 2013, now U.S. Pat. No. 9,414,454, U.S. patent application Ser. No. 13/235,103, filed on Sep. 16, 2011, now U.S. Pat. No. 9,131,561, U.S. patent application Ser. No. 13/235,127, filed on Sep. 16, 2011, now U.S. Pat. No. 9,277,605, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards (PCBs) and/or related components (e.g., including but not limited to metal core printed circuit boards (MCPCBs), flexible circuit boards, dielectric laminates, ceramic based substrates, and the like), ceramic or metal boards having FR4 and/or electrical traces arranged on one or multiple surfaces thereof, high reflectivity ceramics (e.g., alumina) support panels, and/or mounting elements of various materials and conformations arranged to receive, support, and/or conduct electrical power to solid state emitters. Electrical traces described herein provide electrical power to the emitters for electrically activating and illuminating the emitters. Electrical traces may be visible and/or covered via a reflective covering, such as a solder mask material, Ag, or other suitable reflector.

In some embodiments, one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selectively activating sets of solid state emitters according to the present subject matter may be provided using the circuitry and/or techniques described in commonly assigned U.S. patent application Ser. No. 14/221,839, published as U.S. Publication No. 2015/0257211 A1, the disclosure of which was previously incorporated hereinabove by reference.

The term "color" in reference to a solid state emitter refers to the color and/or wavelength spectrum of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; U.S. patent application Ser. No. 11/566,440, filed on Dec. 4, 2006, now U.S. Pat. No. 7,213,940; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

Phosphor and phosphor compounds as disclosed herein can in some aspects comprise one or more of a wide variety of wavelength conversion materials or color conversion components including luminescent materials. Examples of luminescent materials (lumiphors) include phosphors, Cerium-doped Yttrium Aluminum Garnet (YAG) (e.g. LuAG:Ce), Nitrides, Oxy-Nitrides, scintillators, day glow tapes, nanophosphors, quantum dots (e.g., such as provided by NNCrystal US Corp., Fayetteville, Arkansas), and inks that glow in the visible spectrum upon illumination with (e.g., ultraviolet) light. Inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric matrix) arranged to cover or partially cover one or more solid state light emitters. One or more luminescent materials useable in devices as described herein may be down-converting or up-converting, or can include a combination of both types.

Wavelength conversion materials can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to embodiments of LED structures having a light source that comprises LEDs. The LED packages can be arranged in different ways and are relatively small, while at the same time are efficient, reliable and cost effective. The embodiments according to the disclosure herein can have different shaped encapsulants, and can emit light with improved or similar efficiency compared to similar LED packages with fully hemispheric encapsulants. In some embodiments where a plurality of LEDs are mounted on a substrate, the spacing between each LED chip can be controlled to optimize the intensity of light output from the LED package. The LED packages according to the disclosure herein can also be smaller and less expensive to manufacture.

The disclosure herein is described with reference to example embodiments, but it is understood that the disclosure herein can be embodied in many different forms and should not be construed as limited to the embodiments set forth herein. In particular, the disclosure herein is described below in regards to certain LED apparatuses having LEDs in different configurations, but it is understood that the disclosure herein can be used for many other LED packages with other LED configurations. LED packages using the disclosure herein can also have many different shapes beyond those described below, such as rectangular, and the solder pads and attach pads can be arranged in many different ways. In other embodiments, the emission intensity of the different types of LEDs can be controlled to vary the overall LED package emission.

The embodiments described herein are with reference to an LED or LEDs, but in accordance with the disclosure herein and in some aspects LEDs as used herein can include LED chips or any other suitable structure or structures. For example, LEDs as used herein can be individual junctions of a monolithic LED. For example, instead of being completely separate LED chips, the LEDs can each be a LED region all on a common substrate that can have different types of monolithic junctions. A mesa between the LEDs and on the common substrate can extend to certain layers or can extend all the way to or from the common substrate. Therefore, a monolithic LED can comprise more than one LED junctions on a common substrate, and the gaps between the LEDs can be formed by the mesas that can at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

Coatings, encapsulants, encapsulant layers, and the like are disclosed herein and can comprise any material that provides mechanical, chemical, and/or environmental protection to a substrate, reflective layer, or other LED component. A coating, encapsulant and/or encapsulant layer can be configured in some embodiments as a layer that covers a substantially horizontal or vertical surface, and in some aspects can comprise a layer disposed on top of another layer, surface or structure whether or not it fully surrounds all sides of the other layer, surface or structure. In some embodiments a coating, encapsulant and/or encapsulant layer can comprise or consist of a dielectric as disclosed herein. It is also understood that when an feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Embodiments of the present disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances are expected. Embodiments of the disclosure should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the disclosure herein.

As used herein, the term "dark" or "black" refers for example to a material having a reflectivity below a threshold and a transmittance below a threshold. For example and without limitation, the material can have a reflectivity below 70% or below 50%, or the material can have a reflectivity below 6%. The material can have a transmittance of 20% per mm of thickness or less and a reflectivity below 70% or below 50%.

Coating materials disclosed herein can in some aspects comprise a number of encapsulating layers, coatings and/or dielectric materials and compounds, including for example silicon oxide, silicon nitride, aluminum oxide, titanium dioxide, non-metallic oxides, non-metallic nitrides, tantalum oxide, aluminum, nickel, titanium, tungsten, platinum, combinations thereof or alloys thereof, etc. In some aspects such encapsulants, coatings and/or dielectrics can comprise one or more materials arranged to provide desired electrical isolation and high thermal conductivity. For example, a dielectric can provide a desired electrical isolation between electrical traces and/or sets of solid state emitters. In some aspects, such substrates can comprise ceramic such as alumina ($Al_2O_3$), aluminum nitride (AlN), silicon carbide (SiC), silicon, or a plastic or polymeric material such as polyimide, polyester, metal, silicone, epoxy, etc.

Disclosed herein are LED apparatuses or devices that are particularly useful for providing bright light from LEDs mounted on a substrate. In some applications, it may be desirable to group LEDs of different colors close together while still isolating the light output from each individual device.

The devices and methods disclosed herein provide a solution to this need. By providing a first underfill encapsulant layer and/or subsequent dark layers, the direction and sharpness of emitted light can be more easily controlled. In a preferred embodiment, the dark layer can be a powder-coating material, which allows the use of a variety of conventional materials known to the art. The devices and methods herein also facilitate the use of LEDs having top-mounted bonding pads (e.g., wirebond or horizontal die). A desired surface finish and flatness can be achieved by removing a portion of the dark layer, such as by grinding, and optionally applying a final top layer.

In some aspects, an LED apparatus can have a substrate, one or more LEDs that can be devoid of or have no reflective material on a lower surface facing the substrate, and an encapsulation or encapsulant portion or layer that can serve as or at least in part include or consist of an underfill portion or layer. The underfill layer is applied after the LEDs are attached to the substrate, and it is not used to electrically bond the LEDs to the substrate.

In another aspect, an LED apparatus can have a powder-coating layer that covers the substrate. The powder-coating material can be used as an encapsulant to cover the LEDs, and it can be formed from epoxy compounds such as those traditionally used as powder coating paints. These encompass broad classifications such as epoxy, epoxy-polyester hybrid, aliphatic urethane, TGIC polyester, non-TGIC polyester, silicone, silicon-modified polyester, or combinations thereof. Along with traditionally molded materials, the powder-coating material can further have added fillers such as minerals, titania, pigments, or silica. Powder-coating can advantageously allow high ratios of filler because flow properties are less stringent than non-powder-coating techniques. Additionally, the use of powder-coating can result in an encapsulant layer that is less than about 0.2 mm thick.

In yet another aspect, an LED apparatus or device can combine the above features to include a substrate, one or more LEDs, an underfill layer that is a clear layer, and a dark layer. In this embodiment, the clear layer covers the surfaces of the LEDs, and the dark layer can cover substantially the entire surface of the clear layer. In some aspects, the thickness of the dark layer can be, for example, in the range of about 0.01-0.1 mm. To extract light from the LEDs, the dark layer can be removed from some areas by any suitable technique such as by grinding or sanding. The dark layer can in some aspects be removed only from a region directly above the top surfaces of the LEDs. The device will therefore have an exposed portion of the LED, providing a window for the light to escape from the device. The dark layer can be disposed, modified, or removed such that a portion of the clear layer remains above the LED, or such that the outer surface of the layers are flush with an upper surface of an LED.

In a further aspect, a method of producing a panel of such LEDs is for example described. The method includes applying the layers and then removing at least a portion of one or more layers in a region above the LEDs. The layers can be removed by any suitable technique such as by grinding or sanding, for example. The depth of the removal can be controlled by a variety of techniques, such as and without limitation, a mechanical stop, a chip height, or by a timed operation. The method can also include optional steps of applying additional layers and components, such as a clear or semi-clear top coat, or opaque or black sidewalls.

It is to be further understood that the resulting layer state over the top surface of the LEDs can be equally accomplished by approaches that are alternatives to removal, such as selective deposition, masking, stenciling, lithography, etc.

In yet another aspect, a method of coating an LED with a powder-coating material is described. The method includes applying material to an LED or substrate using conventional powder-coating methods used in painting applications.

In a first embodiment depicted for example in FIG. 1, an LED apparatus generally designated 100 has a substrate 114, one or more LEDs 112 disposed over substrate 114, and an encapsulation or encapsulant portion or layer 110 that can in some aspects also serve as an underfill portion or layer. LEDs 112 are disposed on a top surface of substrate 114 and are bonded to substrate 114. LEDs 112 can be for example and without limitation, direct-attach, horizontal, wirebond, or other types of LED. LED apparatus 100 can further comprise bonding and connection features such as, for example, electrical traces 140, solder bumps 146, bond pads 150, mounting pads 142, and vias 144. Encapsulant layer 110 can be a separate material from the bonding and connection features and can be disposed over at least a portion of or over all of substrate 114. Encapsulant layer 110 can be disposed around and at least partially or completely under the LEDs 112 and with or without covering the top surfaces of LEDs 112. All open spaces or voids under LEDs can be filled by encapsulant layer 110. Encapsulant layer 110 can be either a reflective material or a non-reflective or dark material, for the purpose of increasing the brightness of the LED or for reducing the reflection. The amount of light from LED 100 can therefore be controlled or regulated, at least in part, by use of encapsulant layer 110. When encapsulant layer 110 comprises a reflective material, light output is increased from LED 100. When encapsulant layer 110 comprises a dark or non-reflective material, light output is decreased from LED 100. It is also envisioned that encapsulant layer 110 can comprise a combination of both reflective material and dark or non-reflective material and that the desired portions can be selectively placed or positioned on LED 100 for desired light output. In some aspects LED 112 is devoid of any reflective material on a lower surface facing substrate 114 and the light-reflecting features of LED device 100 are provided only by encapsulant layer 110.

Figure 2A:
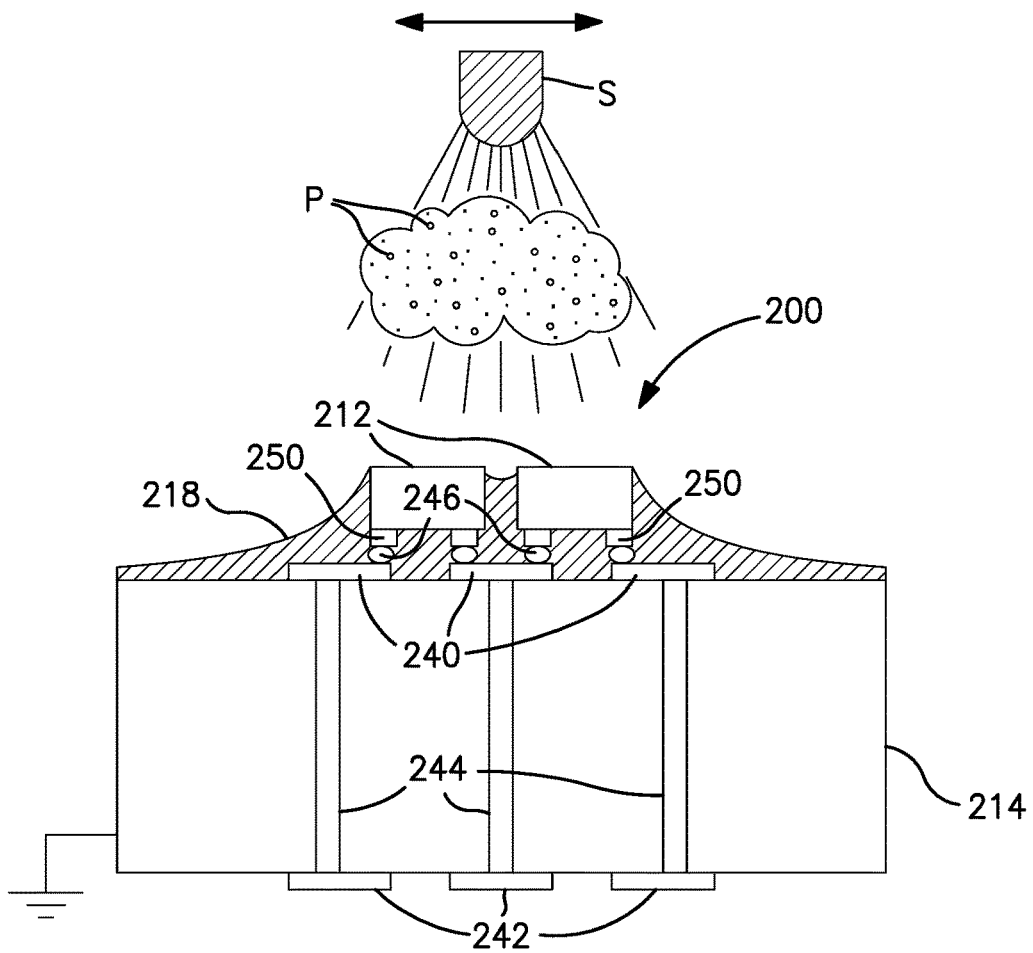
FIGS. 2A-2B are cross-sectional side views of an embodiment of an LED apparatus.

In another embodiment for example, FIG. 2A depicts an LED apparatus generally designated 200 with a powder-coating layer 218 disposed on substrate 214. LED apparatus 200 can further comprise, for example, bonding and connection features such as electrical traces 240, solder bumps 246, bond pads 250, mounting pads 242, and vias 244.

Figure 2B:
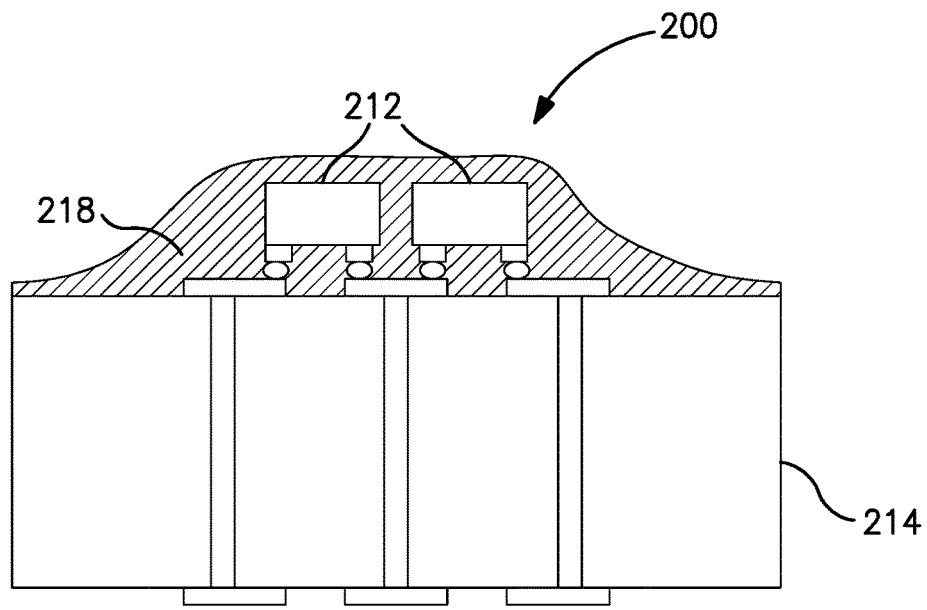

Powder coating layer 218 can be applied for example in a conventional electrostatic application process, such as by imparting an electric charge to powdered particles P and using a sprayer S to spray the particles onto LED apparatus 200, which has been electrically grounded. In some aspects, sprayer S can be stationary, or it can be mobile. After coating, the process typically involves curing the powder with heat, such as in an oven. Powder-coating layer 218 can be disposed only on the substrate as shown in FIG. 2A. Alternatively, powder-coating layer 218 can extend above the top surfaces of LEDs 212 and cover both substrate 214 and LEDs 212 as shown in FIG. 2B. All open spaces or voids under LEDs can be filled by powder-coating layer 218. LED apparatus 200 can further comprise, for example, bonding and connection features such as electrical traces 240, solder bumps 246, bond pads 250, mounting pads 242, and vias 244. Powder-coating layer 218 can be a separate material from the bonding and connection features.

Figure 3A:
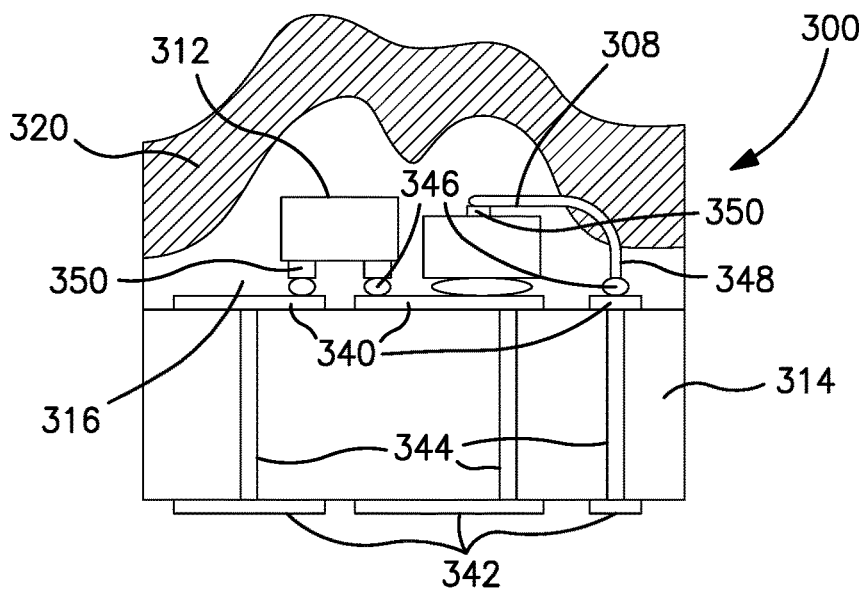
FIGS. 3A-3F are cross-sectional side views of another embodiment of an LED apparatus.
Figure 3B:
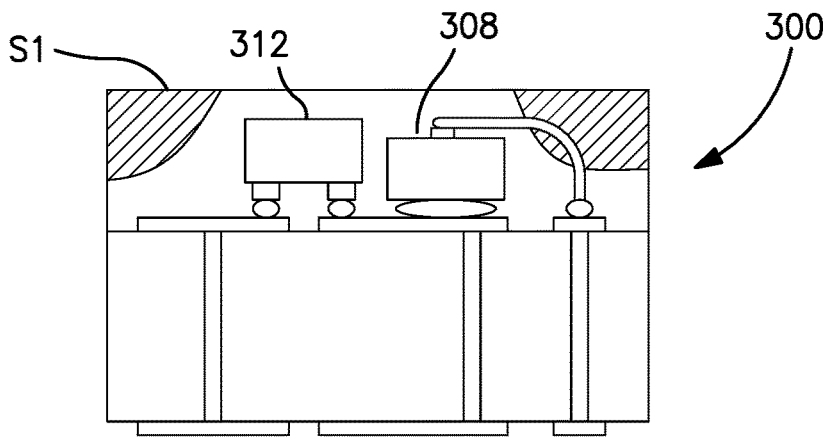
Figure 3C:
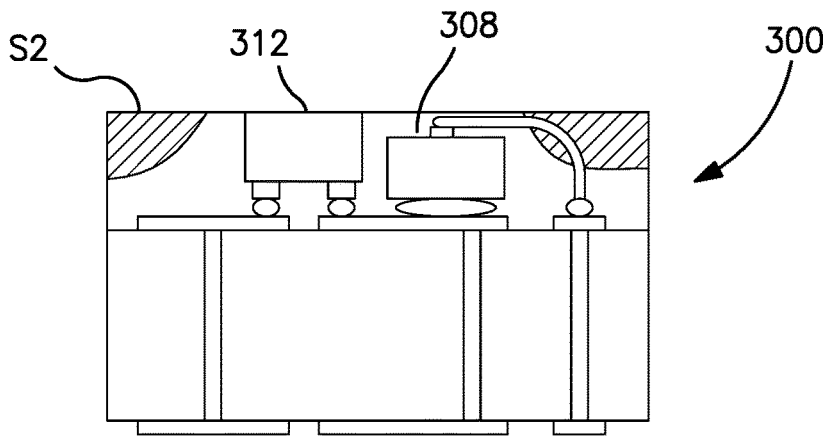

FIGS. 3A-3C illustrate for example an LED device with both a first light-transmissive layer 316 and an encapsulant layer 320. If desired, a wavelength conversion material, such as described previously for example, can be added to or made part of light-transmissive layer 316 to achieve a translucent or smoky appearance. Additionally, encapsulant layer 320 can be disposed in one or multiple steps. Encapsulant layer 320 can be disposed such that the final product of LED device 300 is substantially or completely devoid of encapsulant layer 320 in a region above LEDs 312 and 308.

More particularly, FIG. 3A illustrates an LED apparatus generally designated 300. LEDs 308 and 312 are covered by a light-transmissive layer 316, which can surround and underfill LEDs 312. Light-transmissive layer 316 can in turn be then covered by a dark encapsulant layer 320 which can be disposed over all or a portion of light-transmissive layer 316 and which can be provided as a powder-coated material or by other approaches as described herein, such as dispensing, molding, stenciling, screen printing, spinning, spraying, or other approach. LED apparatus 300 can further comprise bonding and connection features such as, for example, electrical traces 340, solder bumps 346, mounting pads 342, bond pads 350, and vias 344. LED 308 can be a wirebonded type LED with a top-mounted connection lead wire 348 connected to an electrical trace on substrate 314.

FIGS. 3B and 3C depict two embodiments of LED apparatus 300 after dark encapsulant layer 320 has been removed. In FIG. 3B, an outer surface S1 of LED apparatus 300 is in a plane above the tallest LED. Surface S1 can be produced, for example, by grinding, sanding, or cutting away a portion of the layers. Portions of dark layer 320 and light-transmissive layer 316 have been removed to create a window above LEDs 312 for light to escape. In FIG. 3C, the layers have been removed to a greater extent such that the level of the top surface of the tallest LED mounted on substrate 314. In this case surface S2 is substantially coplanar with the tallest LED. It is also to be understood that, with some removal methods, it is possible that the top of the LED can become slightly higher than surface S2.

Figure 3D:
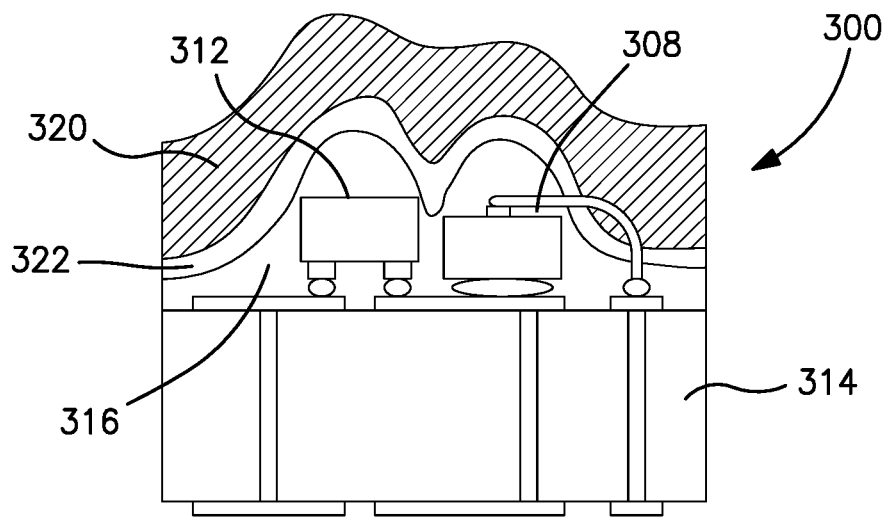
Figure 3E:
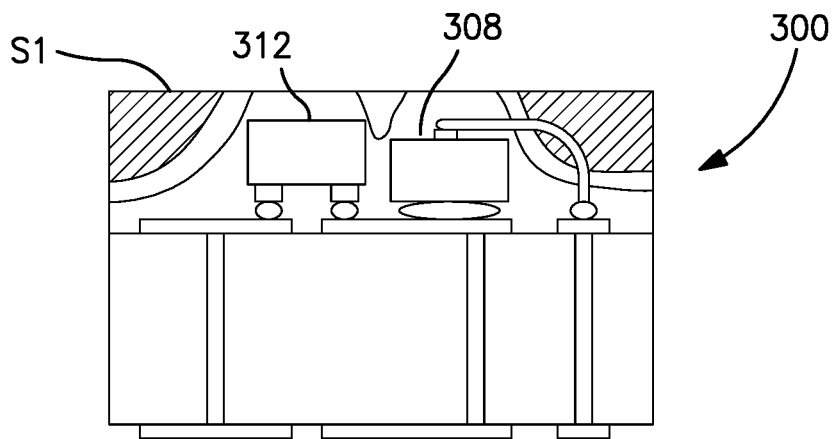
Figure 3F:
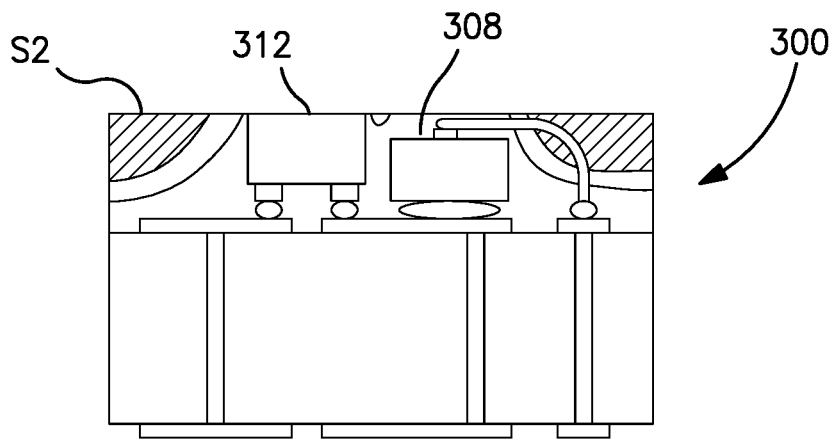

FIGS. 3D-3F illustrate LED apparatus 300 with an optional intermediate reflective layer 322, which can be disposed or positioned between light-transmissive layer 316 and dark layer 320. This optional intermediate reflective layer 322 can be, for example, pigmented white to increase brightness. The addition of an intermediate reflective layer can redirect internally reflected light to a specific portion of LED apparatus 300 in order to increase the amount of emitted light. The layer removal includes removing reflective layer 322 from a region of the apparatus above the LEDs. In other aspects FIGS. 3E and 3F are similar to FIGS. 3B and 3C, showing surfaces S1 and S2 respectively. Surface S1 can, for example, have a height above substrate 314 such that a portion of light-transmissive layer 316 remains above LEDs 312, while surface S2 can have a height above substrate 314 substantially the same as or slightly lower than the height of the tallest LED mounted on substrate 314.

Figure 4:
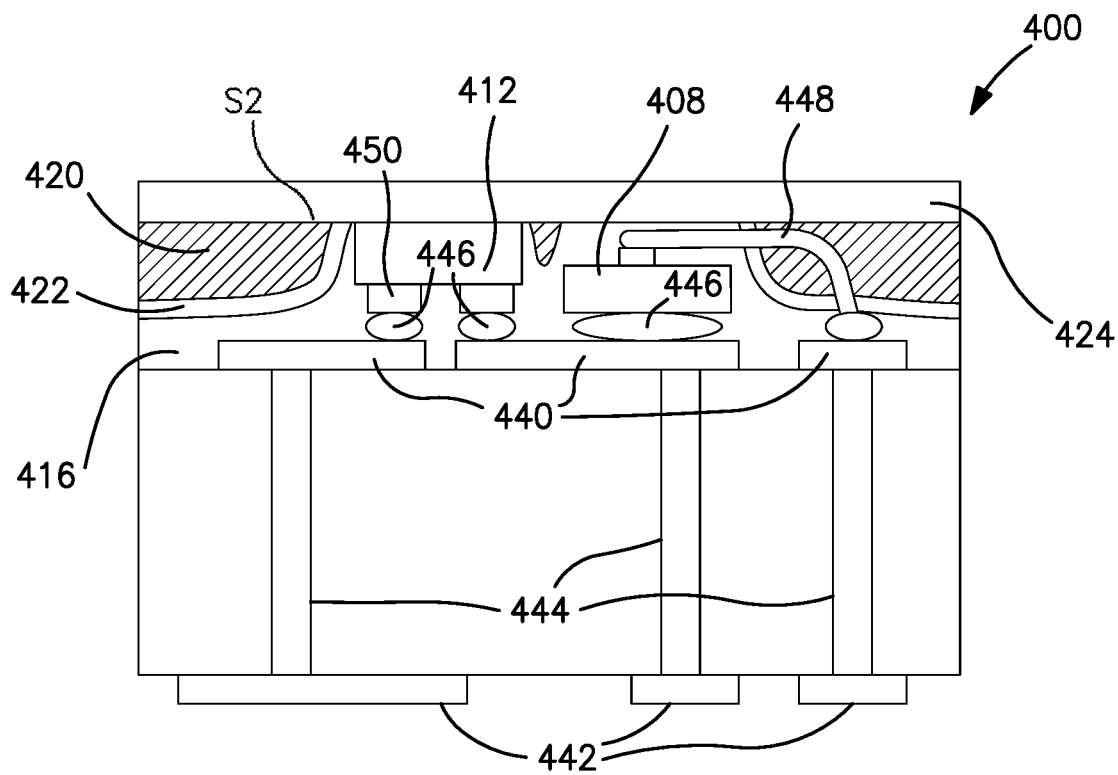
FIGS. 4-9 are cross-sectional side views of various embodiments of an LED apparatus.

After the clear and dark layers have been removed, LED apparatus 300 can optionally have one or more additional outer layers of material that are applied after removing the layers from regions above the LEDs. This is illustrated in FIG. 4. LED apparatus generally designated 400 can be identical to LED apparatus 300 as depicted in FIG. 3F but with an outer layer that is applied after surface S2 is created.

Additional layer 424 is disposed, for example, on outer surface S2 of LED apparatus 400, where surface S2 is at a height substantially the same as or slightly lower than the height of the tallest LED mounted on substrate 414. Additional layer 424 can be, for example and without limitation, a clear or translucent layer. It can further have a surface finish that is adapted to affect the properties of the emitted light, such as, for example, a level of gloss anywhere from polished to matte.

FIGS. 4-8 also illustrate further examples of LED configurations which can be used in an LED apparatus. In FIG. 4, LED apparatus generally designated 400 can comprise bonding and connection features such as, for example, electrical traces 440, solder bumps 446, mounting pads 442, bond pads 450, and vias 444. LED apparatus 400, for example can comprise one or more LED such as LED 412, which is a horizontal LED with solder bumps 446 beneath LED 412 for making electrical and mechanical contact. LED apparatus 400 can further comprise LED 408, which is a wirebonded LED that has both a solder bump 446 beneath the LED and a connection lead wire 448 on the top surface.

With the devices and methods disclosed herein, it is possible to encapsulate top-mounted LEDs such as wirebonded LED 408 and subsequently remove encapsulation material without damaging the connection lead wire. For example, as shown in FIG. 4, the height of LED 412 is greater than that of wirebonded LED 408 and can be used to control the depth of layer removal.

Figure 5:
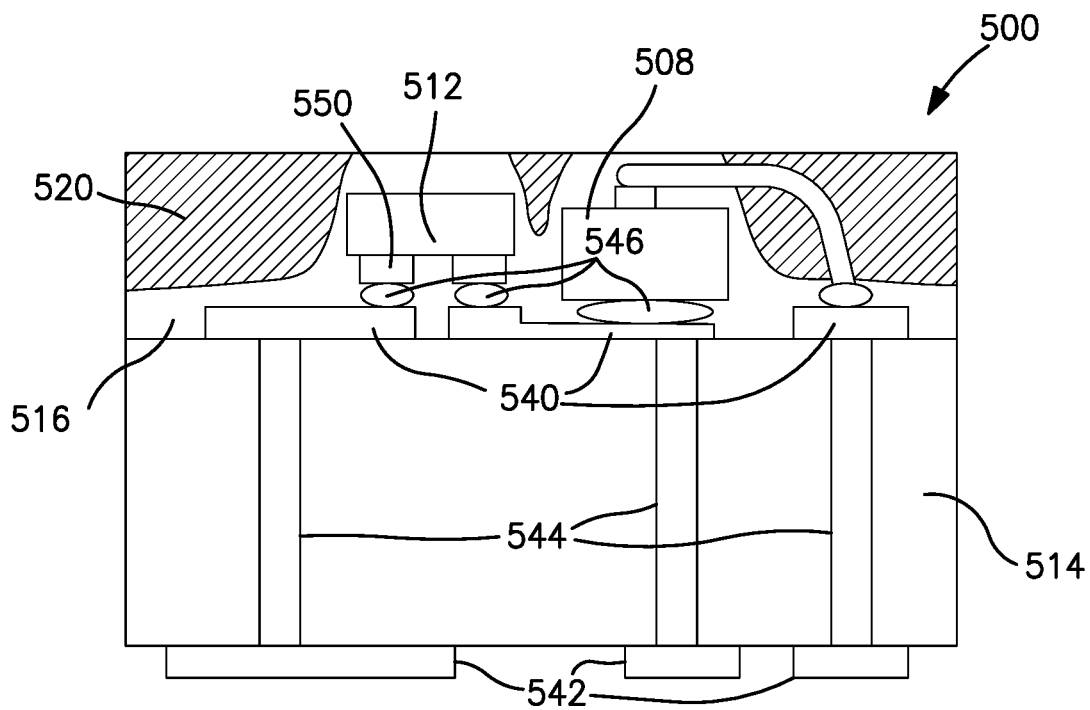

However, it is not strictly necessary to have wirebonded LEDs at a lower height than other LEDs. For example, FIG. 5 depicts LED apparatus generally designated 500. In FIG. 5, LED apparatus 500 can comprise bonding and connection features such as, for example, electrical traces 540, solder bumps 546, mounting pads 542, bond pads 550, and vias 544. The connection lead wire 548 of wirebonded LED 508 can be taller than LED 512. Dark layer 520 is removed such that a portion of light-transmissive layer 516 remains in the region over the LEDs, similar to FIGS. 3B and 3E, thus providing a protective region of light-transmissive layer 516 above LEDs 508 and 512.

FIG. 5 also shows another optional configuration for an LED apparatus 500. In this case, electrical trace 540 can have a non-uniform cross section to control the height of the LEDs above substrate 514. The thicknesses of the electrical traces on substrate 514 can have a variable cross section as needed to achieve a desired LED chip height. For example, a single trace can be higher in some areas than in others to adjust the height of connected LEDs.

Figure 6:
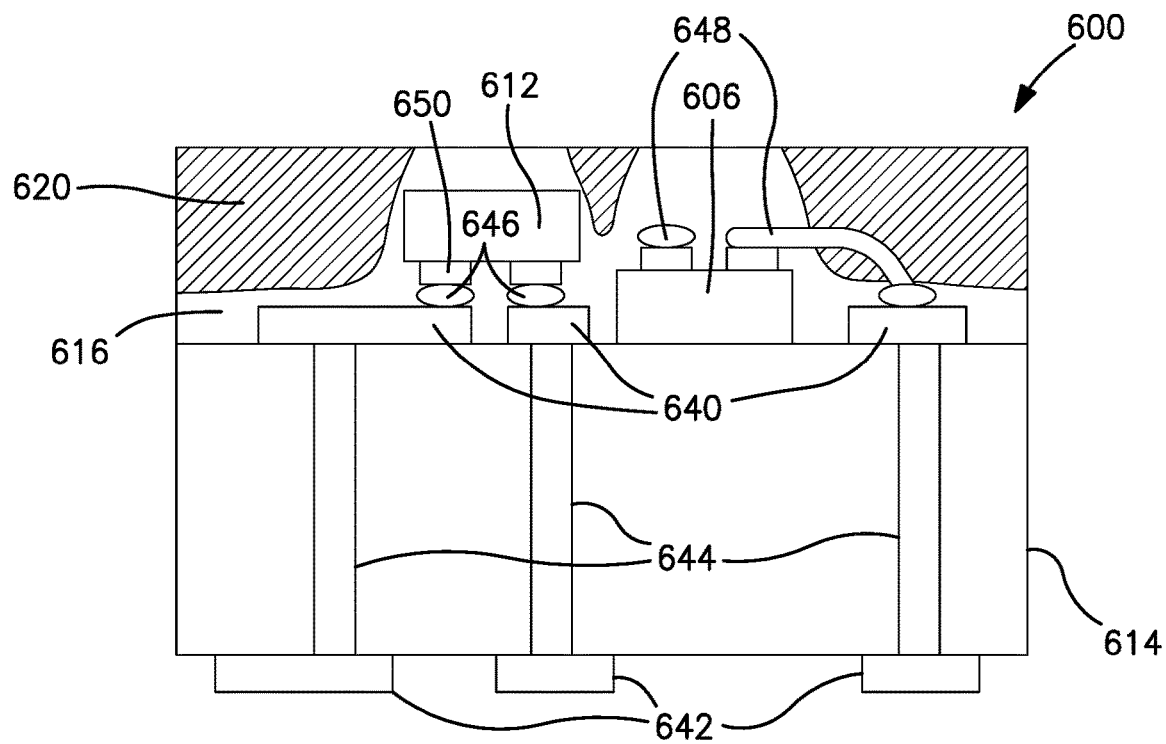

Similarly, the methods and devices described herein can also be used with LEDs having two connection wires on the top surface of the LEDs (i.e., horizontal LEDs), such as is shown for example in FIG. 6. LED apparatus generally designated 600 can comprise bonding and connection features such as, for example, electrical traces 640, solder bumps 646, mounting pads 642, bond pads 650, and vias 644. LED apparatus 600 can have horizontal LED 606, which is mechanically mounted onto substrate 614 with an adhesive and electrically connected by lead wires 648 positioned on the top side of LED 606. Light-transmissive layer 616 can cover the LEDs mounted on substrate 614, and then be covered in turn by dark layer 620. Dark layer 620 can be subsequently removed to a level above the height of lead wires 648 on LED 606.

In each of LED apparatuses 400, 500, 600, 700, 800, and 900, an optional intermediate layer and/or outer layer can be either applied or omitted.

Figure 7:
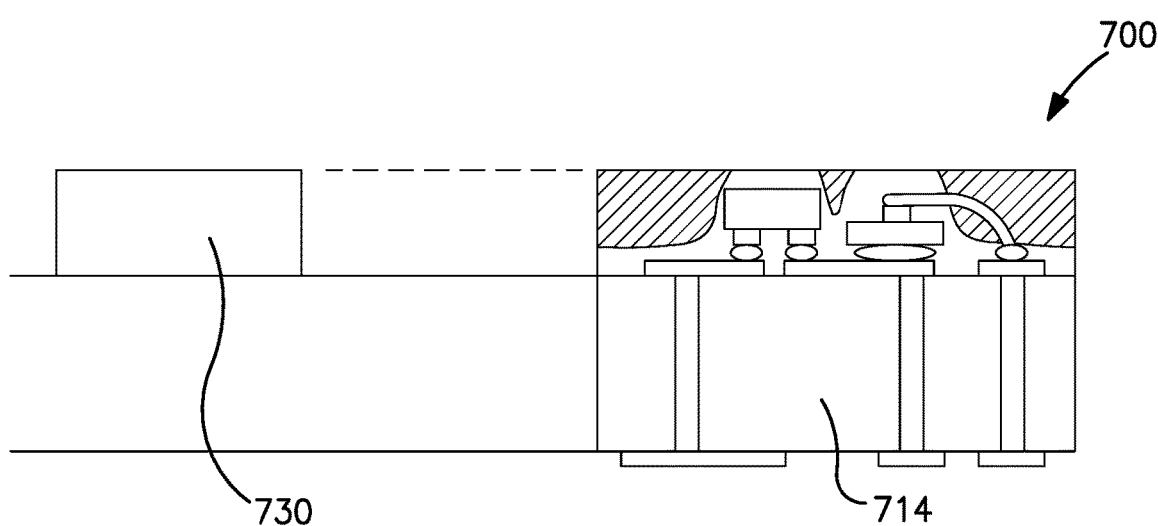

In a further example depicting a different method to control grinding depth, FIG. 7 shows a mechanical stop 730 for an LED substrate generally designated 700. A hard material, such as sapphire, can be used as mechanical stop 730 to halt a sanding device. Mechanical stop 730 can be placed either on substrate 714 or in an area separate from LED apparatus 700.

Figure 8:
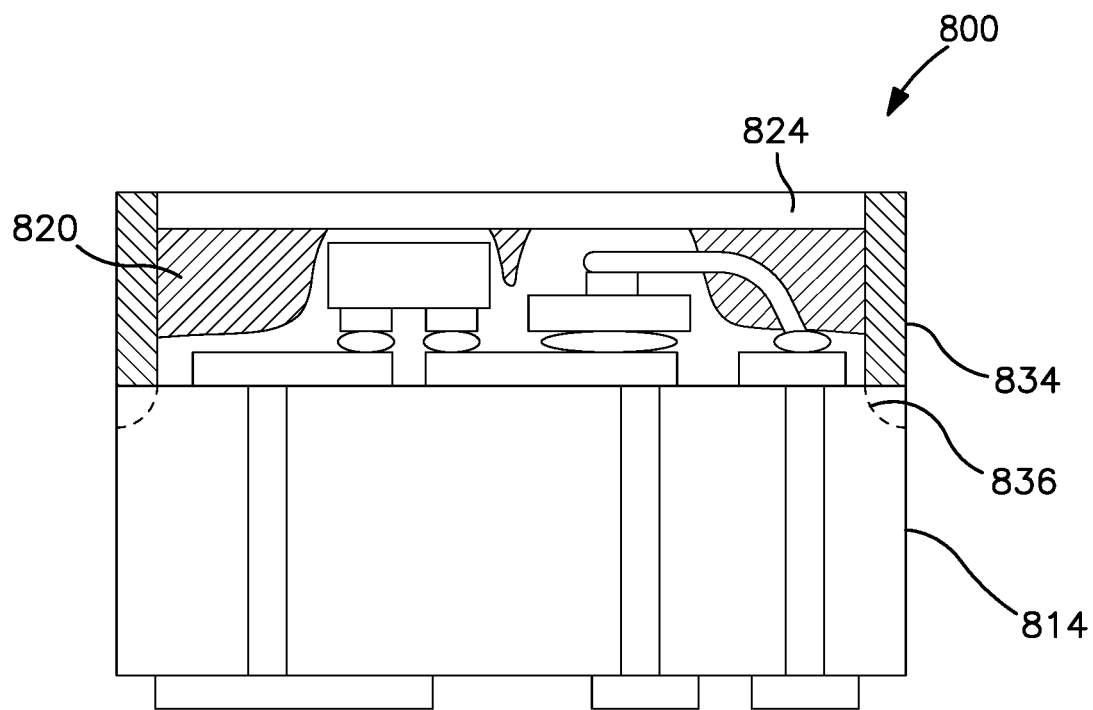
Figure 9:
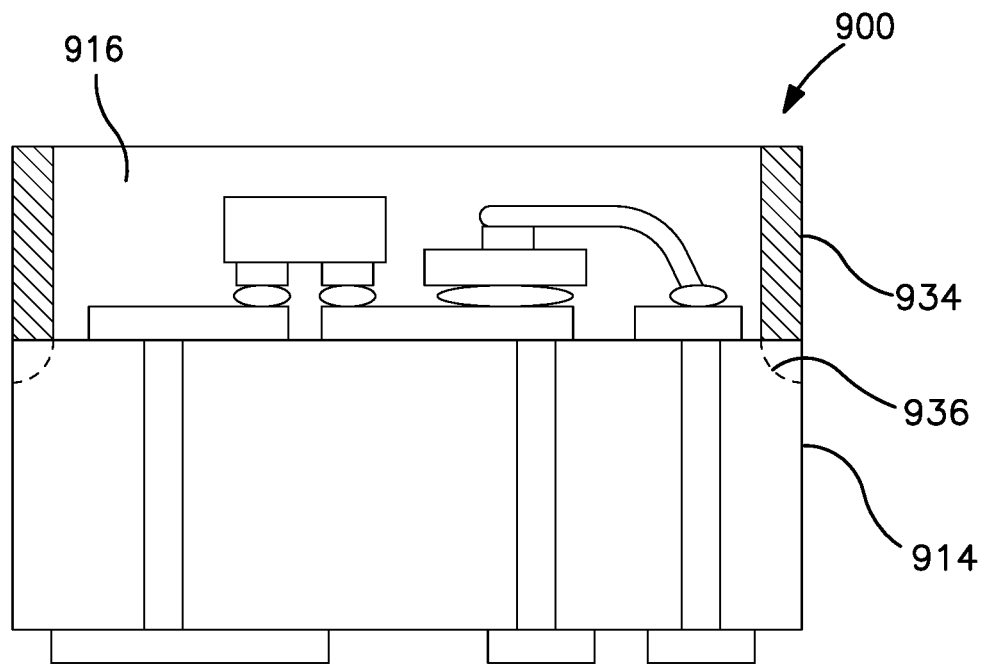

FIG. 8 shows an additional option for controlling light emission in an LED apparatus generally designated 800. To further reduce any undesirable light, a sidewall 834 can be added. The sidewall can be applied after removal of dark layer 820 and after application of optional additional outer layer 824. Sidewall 834 can be created by removing material from a region substantially perpendicular or at an angle to the substrate, and by subsequently applying a black or opaque material to this region. One method of creating a perpendicular plane is to use a saw blade to cut the layers. A saw cut can extend to the surface of substrate 814 as shown in FIG. 8. Alternately, a saw cut can stop short of the surface of the substrate, cutting partially through the encapsulation layers (not shown). Alternatively, a saw cut can extend into substrate 814 as indicated by dotted line 836. In another example, an LED apparatus generally designated 900 can have a single, thick clear or semi-opaque layer 916 surrounded by sidewall 934. This is illustrated by LED apparatus 900 in FIG. 9. Sidewall 934 can by created by extending a saw cut flush with the surface of substrate 914 or by cutting into the surface of substrate 914 as indicated by dotted line 936.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitting diode (LED) apparatus comprising:
   a substrate;
   one or more light emitting diodes (LEDs) that are in contact with a top surface of the substrate and bonded to the substrate;
   one or more light-transmissive layers disposed over the substrate and the one or more LEDs; and
   one or more dark layers disposed over the one or more light-transmissive layers,
   wherein the one or more dark layers are arranged so they do not contact the substrate,
   wherein a top surface of the one or more LEDs is higher than or coplanar with a top surface of the one or more dark layers, and
   wherein a region above the one or more LEDs is substantially or completely devoid of the one or more dark layers.

2. The LED apparatus of claim 1, wherein the one or more light-transmissive layers are clear.

3. The LED apparatus of claim 1, wherein the one or more dark layers are black.

4. The LED apparatus of claim 1, wherein the region above the one or more LEDs is further devoid of the one or more light-transmissive layers.

5. The LED apparatus of claim 1, wherein the one or more light-transmissive layers are disposed at least partially under the one or more LEDs, between the one or more LEDs and the substrate.

6. The LED apparatus of claim 1, wherein a thickness of the one or more dark layers is in a range of about 0.01-0.2 mm.

7. The LED apparatus of claim 1, further comprising an intermediate reflective layer disposed between the one or more light-transmissive layers and the one or more dark layers.

8. The LED apparatus of claim 1, wherein any of the layers is a powder-coated material.

9. The LED apparatus of claim 8, wherein the one or more dark layers comprise epoxy, epoxy-polyester hybrid, aliphatic urethane, TGIC polyester, non-TGIC polyester, silicone, silicon-modified polyester, or combinations thereof.

10. The LED apparatus of claim 8, wherein any of the layers further comprise a filler material such as a mineral or silica.

11. The LED apparatus of claim 1, wherein any of the layers is adapted to be removed by grinding, buffing, lapping, and/or sanding.

12. The LED apparatus of claim 1, further comprising at least one additional layer disposed over the one or more dark layers and an exposed portion of the one or more light-transmissive layers.

13. The LED apparatus of claim 1, further comprising opaque sidewalls.

14. The LED apparatus of claim 1, wherein at least one of the one or more LEDs is a wire-bonded LED.

15. The LED apparatus of claim 1, wherein:
   the one or more LEDs comprise a plurality of LEDs; and
   the plurality of LEDs comprise at least one wirebonded LED and at least one non-wirebonded LED.

16. The LED apparatus of claim 15, wherein the at least one non-wirebonded LED has a thickness that is greater than a thickness of the at least one wirebonded LED.

17. The LED apparatus of claim 15, wherein the plurality of LEDs comprises LEDs of different thicknesses, and the LEDs are disposed on the substrate such that top surfaces of the LEDs are substantially coplanar.

18. The LED apparatus of claim 15, wherein the LEDs are disposed on electrical traces of different thicknesses.

19. The LED apparatus of claim 1, wherein at least a portion of the one or more light-transmissive layers is disposed between the one or more dark layers and the substrate.

20. The LED apparatus of claim 1, further comprising an additional layer disposed over the one or more dark layers, the additional layer comprising a surface finish that comprises a matte finish.

* * * * *